United States Patent
Penn (10) Patent No.: US 7,711,017 B2
(45) Date of Patent: May 4, 2010

(54) APPARATUS AND METHOD FOR PRODUCING LIGHT USING LASER EMISSION

(75) Inventor: Steven Monroe Penn, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 428 days.

(21) Appl. No.: 11/617,032

(22) Filed: Dec. 28, 2006

(65) Prior Publication Data

US 2008/0159344 A1  Jul. 3, 2008

(51) Int. Cl.
*H01S 3/10* (2006.01)
(52) U.S. Cl. .............................. 372/21; 372/22; 372/64
(58) Field of Classification Search ................... 372/21, 372/22
See application file for complete search history.

(56) References Cited

U.S. PATENT DOCUMENTS 5,163,060 A * 11/1992 Mitra et al. .................... 372/21
2004/0202209 A1 * 10/2004 Huang et al. .................. 372/21

OTHER PUBLICATIONS

Jin U. Kang et al., Fiber-Laser SHG Yields Broad Bandwidth at High Power, Laser Focus World, Feb. 2002.

* cited by examiner

*Primary Examiner*—Dung T Nguyen
(74) *Attorney, Agent, or Firm*—Charles A. Bill; Wade James Brady, III; Frederick J. Telecky, Jr.

(57) ABSTRACT

An apparatus is provided that includes a laser that produces light at a first wavelength, an optical element that converts the light at the first wavelength received at an input end thereof into light at a second wavelength, and an optical interface proximate the input end of the optical element that directs light at the second wavelength through the optical element toward an output end of the optical element.

14 Claims, 5 Drawing Sheets

APPARATUS AND METHOD FOR PRODUCING LIGHT USING LASER EMISSION

BACKGROUND OF THE DISCLOSURE

1. Field of the Disclosure

The disclosure herein relates generally to apparatus and method for producing visible light using laser emission.

2. Description of the Related Art

A variety of display systems, such as televisions and projectors, utilize light illumination systems to project images on display media. Image brightness is a useful metric in such display systems. The brightness can limit the size of a projected image and can be a factor in how well the image can be seen in high levels of ambient light. One approach to increasing brightness of a display has been to employ solid-state lasers. Conventional solid-state lasers typically emit light in infrared (IR) wavelengths. A frequency-multiplying optical element converts the IR laser emissions into visible light, such as red, green, or blue light, depending on the initial frequency or wavelength of the IR laser emissions. The resulting visible light may then be used to illuminate optical elements, such as a digital micromirror device (DMD) or a spatial light modulator (SLM) of the projection display system.

Often a filter, such as a Volume Bragg Grating (VBG), at the exit end of the frequency-multiplying element is used to pass a wavelength of narrowband (red, blue or green) light corresponding to the wavelength conversion properties of the frequency-multiplying element. Such a filter is aligned to reflect IR back to the relatively small aperture of the laser. A second filter at the interface between the laser and the frequency-multiplying element polarizes the light and passes the IR light. The second filter also is utilized to reflect the visible light back emission out of the frequency-multiplying element and the optical resonant cavity, which results in the use of additional optical and mechanical components that are relatively precisely aligned. The overall output efficiency of such systems can be relatively low. Accordingly, there is a need to provide an improved laser illumination system.

SUMMARY OF THE DISCLOSURE

The disclosure in one aspect provides an apparatus that includes a laser that produces light corresponding to a first wavelength, an optical element that converts the light corresponding to the first wavelength received at a first surface thereof into light corresponding to a second wavelength, and a first optical interface that directs light corresponding to the second wavelength through the optical element toward a second surface of the optical element.

in another aspect, the apparatus may include a frequency multiplier that converts light at a first wavelength received at a first end thereof into light at a second wavelength and passes the light at the second wavelength toward a second end thereof, and an optical interface associated with the first end that directs light at the second wavelength through the frequency multiplier toward the second end. In one aspect, the frequency multiplier may be configured to double the frequency of an input laser light. In another aspect, the first wavelength may correspond to an infrared light and the second wavelength may correspond to a visible light. A second interface may be utilized to reflect light at the second wavelength proximate the second end of the frequency multiplier back into the frequency multiplier In another aspect, a method is provided that includes producing a laser light at a first wavelength, converting the light at the first wavelength into a light at a second wavelength in an optical element, and directing at least a portion of the light at the second wavelength present proximate an input end of the optical element through the optical element and toward an output end of the optical element.

Examples of the more important features of the apparatus and method for producing light using laser emission have been summarized herein rather broadly in order that the detailed description thereof that follows may be better understood, and in order that the contributions to the art may be appreciated. There are, of course, additional features of such apparatus and method that are described hereinafter and which will form the subject of the claims appended hereto.

BRIEF DESCRIPTION OF THE DRAWINGS

The following figures form part of the present disclosure and are included to further demonstrate certain aspects of the claimed subject matter and should not be used to limit the claimed subject matter. The claimed subject matter may be better understood by reference to one or more of these drawings in combination with the description of the drawings presented herein. Consequently, a more complete understanding of the various embodiments and further features and advantages thereof may be acquired by referring to the following description taken in conjunction with the accompanying drawings, in which like numerals have generally been assigned to like elements, wherein:

DETAILED DESCRIPTION OF THE DRAWINGS

Illustrative embodiments of the present claimed subject matter are described in detail below. In the interest of clarity, not all features of an actual implementation are described in this disclosure. It will of course be appreciated that in the numerous implementation-specific embodiments, features may be added or changes may be made by one of ordinary skill in the art having the benefit of the disclosure, which changes, modifications etc. will vary from one implementation to another but fall within the scope of the disclosure and the claimed subject matter.

Figure 1:
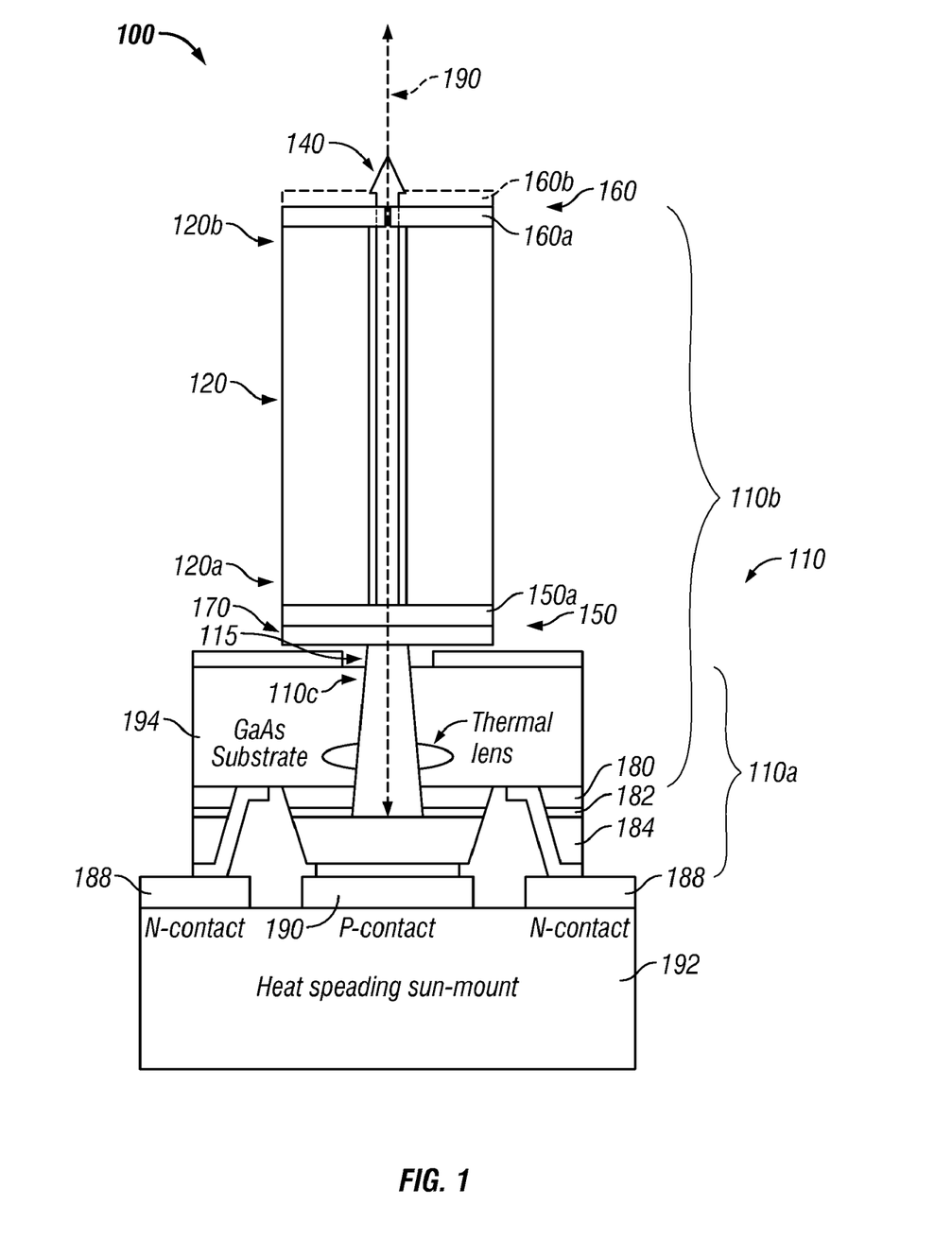
FIG. 1 illustrates an exemplary apparatus for producing light using laser emission and a frequency multiplier according to one embodiment of the disclosure.

FIG. 1 shows an illustrative embodiment of a laser illuminator 100 that converts laser emission at a first frequency to produce a beam of light at a second frequency, according to one embodiment of the disclosure that may be utilized for displaying images on a display medium. In the exemplary embodiments discussed herein, the first frequency is typically an infrared (IR) frequency and the second frequency is typically a frequency of visible light. The laser illuminator 100 is shown to include a laser 110, such as a vertical cavity surface-emitting laser (VCSEL) for producing the IR laser emission. The VCSEL is shown only as an exemplary laser. Any other solid-state laser may be utilized for the purposes of this disclosure. The laser 110 has a die 110a and an extended resonant cavity 110b and produces an IR laser emission 115 that exits the cavity 110a via an aperture 110c and is directed into an optical element 120 at a first surface or end 120a of the optical element. The optical element 120 in one aspect, may be a frequency-multiplying optical element also referred to herein as a frequency multiplier. The laser 110 includes a laser resonator having an upper distributed Bragg reflector (DBR) mirror 180 and a lower DBR mirror 184 and an active region therebetween including one or more quantum wells (QWs) 182 for the generation of the laser emission 115. Typically, the upper and lower mirrors (180 and 182) are doped as p-type and n-type materials, forming a diode junction. The planar DBR mirrors typically include layers of alternating high and low refractive indices. High reflectivity mirrors are typically used in the laser 110 to balance the short axial length of the gain region. The exemplary laser 110 is based on a gallium arsenide (GaAs) substrate 194 which focuses the laser emission via thermal focusing into a beam 115. In one aspect, the p-DBR layer 184 is in contact with n-contacts 188 and p-contacts 190 for pumping of the laser resonator. The n-contacts and the p-contact may be in contact with a heat spreading sub-mount 192 for the purposes of dissipating heat. Although a VCSEL is shown and described as the laser emission source, any other suitable laser emission source, including any suitable solid-state laser, may be utilized for the purpose of this disclosure.

The frequency multiplier 120 has an upstream end portion 120a and a downstream end portion 120b, wherein "upstream" and "downstream" are defined with respect to the direction of propagation of the light emitted from the laser 110. The upstream end portion may also be referred to herein as an input end, and the downstream end portion may also be referred to herein as an output or exit end. Light passes through the input end at a first surface of the frequency multiplier and exits via a second surface at the output end of the frequency multiplier. The frequency multiplier 120 converts a first portion of an input beam, generally an IR laser emission 115, into visible laser light, which results in a visible output light beam 140. In one aspect, the frequency multiplier 120 may include a periodically-poled lithium niobate (PPLN) element or a periodically-poled lithium tantalate (PPLT) element. In one aspect, the output beam 140 may be a collimated, polarized, and broadband visible laser light. In an exemplary embodiment, the frequency-multiplying optical element 120 is a frequency doubler and the output beam 140 therefore has a frequency that is double the frequency of the IR laser emission 115. The output beam 140 typically appears as visible light, such as red, green, or blue light, depending on the initial wavelength of the IR laser emission 115. However, the laser 110 and the optical element 120 may be configured to generate any other color of light. For example, an IR laser emission at a wavelength of about 1060 nanometers (nm) may be converted into an output beam of visible laser light at a wavelength of about 530 nm, visible as green light. The resulting output beam may be used to illuminate further optical elements such as a spatial light modulator as described in FIG. 5 for displaying images via an optical display system such as is described in FIG. 4.

In one aspect, the laser illuminator 100 includes a first optical interface 150 between the laser source 110 and the frequency multiplier 120 that is arranged to transmit the laser emission beam 115 from the laser 110 into the frequency multiplier 120 and to direct light at certain selected wavelengths present at the approximate input end of the frequency multiplier 120 through the frequency multiplier toward the output end. The first optical interface 150, in one aspect, is a color filter that may be aligned with, attached to or coated on the frequency multiplier. The first optical interface 150 may include a wire-grid polarizer 170 and an input filter 150a, both oriented substantially perpendicular to an optical propagation axis 190 of the laser emission 115. Due to the reflections at the output end 120b (discussed below), light may be forward-propagating or backward-propagating along the propagation axis 190 within the frequency multiplier 120. The input filter 150a is selected to generally transmit IR light and reflect visible light and is arranged with respect to the frequency multiplier 120 so as to transmit the IR laser emission 115 into the optical element and to direct or reflect the visible wavelengths of light back into the optical element (i.e. toward the downstream end portion 120b). An exemplary input filter may include a "cold mirror" for reflecting the desired visible wavelengths and transmitting the IR laser emissions. For the purpose of this disclosure a "cold mirror" may be any interface, including a dielectric mirror and a dichroic reflector that reflects visible light and transmits IR light. The input filter 150a may include one or more diffractive elements, one or more holographic elements, one or more dielectric interference filters, and a glass substance or member. The input filter 150a may be integrated with, attached to, or coated directly onto a surface or an end of the frequency multiplier. The input filter 150a may also be polarized, for example, to provide light into the optical element 120 having a particular polarization, such a p-polarization (parallel to the plane of incidence) and thereby providing effective laser output.

The frequency multiplier 120 may include at the output end 120b a second optical interface 160 arranged to reflect the IR laser emission back into the resonant cavity 110b and to transmit the visible laser light from the frequency multiplier 120 to provide the output light beam 140. The output optical element 160 may include an output filter 160a orientated substantially perpendicular to the optical propagation axis 190. The output filter 160a may be integrated with, attached to or coated directly onto a surface or an end of the frequency multiplier. The output filter 160a may include one or more diffractive elements, one or more holographic elements, one or more dielectric interference filters, or a glass substance or member. The output filter is selected to transmit the desired visible wavelengths to provide the output beam 140 and to reflect the wavelengths of the laser emission back into the optical element 120. An exemplary output filter 160a may include a "hot mirror" for reflecting the IR laser emissions and transmitting the desired visible wavelengths. For the purpose of this disclosure, a "hot mirror" may be any interface filter, including dielectric mirror and dichroic reflector that reflects IR light and transmits visible light. If polarization rotation is desired for any downstream optics, a half-wave retarder 160b may be used along with the output filter 160a. The half-wave retarder 160b rotates a polarization of a polarized beam incident from the frequency multiplier 120.

The input filters 150a and the output filter 160a may be designed for proper coupling to the frequency multiplier for efficient energy output of the frequency-multiplied output beam 140, while retaining the IR laser emissions within the extended resonant cavity 110b. Either the input filter 150a or the output filter 160a or both may be polarized along a desired plane, including the p-plane, for substantially increased laser output and/or coupling to the frequency multiplier. One or both of the input filter 150*a* and the output filter 160*a* may be made of durable materials, such as dielectrics or glass, that typically do not substantially degrade under exposure to high-energy IR laser emissions and visible laser light.

Due to the reflective aspects of the input filter 150*a* and the output filter 160*a*, the frequency multiplier 120 typically contains multiple beams of both IR laser emissions and visible light propagating backward and forward along the direction of the propagation axis 190. The frequency multiplier 120 may be dimensioned or adjusted to be of a length so as to reduce or minimize interference patterns between forward-propagating and backward-propagating beams. The distance between the input filter 150*a* and the output filter 160*a* may be selected to reduce interference patterns between the forward-propagating and the backward-propagating beams within the frequency multiplier 120. The cut-on and the cut-off wavelengths of the input filter 150*a* and the output filter 160*a* may be relatively loosely specified, due to the relatively wide separation between the wavelengths of the IR spectrum and the visible spectrum.

Figure 2:
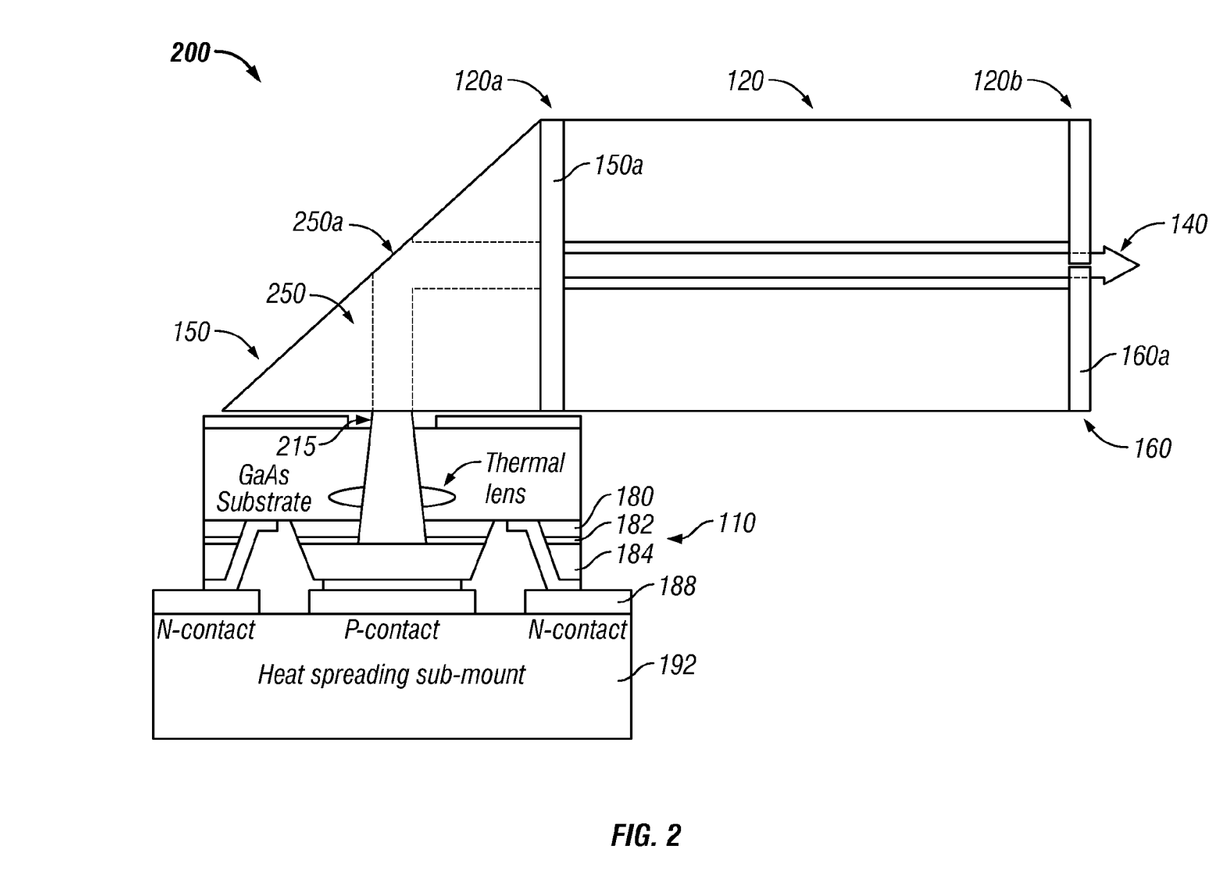
FIG. 2 illustrates an alternative embodiment of an apparatus for producing light using laser emission and a frequency multiplier.

FIG. 2 shows an alternative embodiment 200 of the present disclosure for multiplying the frequency of a laser emission. The apparatus of FIG. 2 includes a VCSEL 110 and a frequency multiplier 120 having a first surface at an input end 120*a* and a second surface at an output end 120*b*. The laser emission 215 produced by the VCSEL is directed into the input optical element 150 which may further include a prism 250 having a reflection surface and a polarizing beam splitter 250*a* disposed along the reflection surface of the prism. The polarizing beam splitter 250*a* polarizes and redirects (folds) the IR laser emission by about 90° toward the frequency multiplier 120. The first surface of the frequency multiplier may be covered by a first optical interface, such as an input filter 150*a* arranged to transmit IR laser emissions into the frequency multiplier 120 and reflect visible wavelengths from within the frequency multiplier back into the frequency multiplier. The second surface of the frequency multiplier 120 also may be covered by a second optical element, such as an output optical element 160 arranged to reflect the IR laser emission back into the frequency multiplier and transmit the visible laser light out of the frequency multiplier to provide output beam 140. The output optical element 160 may further include output filter 160*a* designed to transmit a selected wavelength such as a wavelength of the visible spectrum (i.e., red, green, blue).

Figure 3:
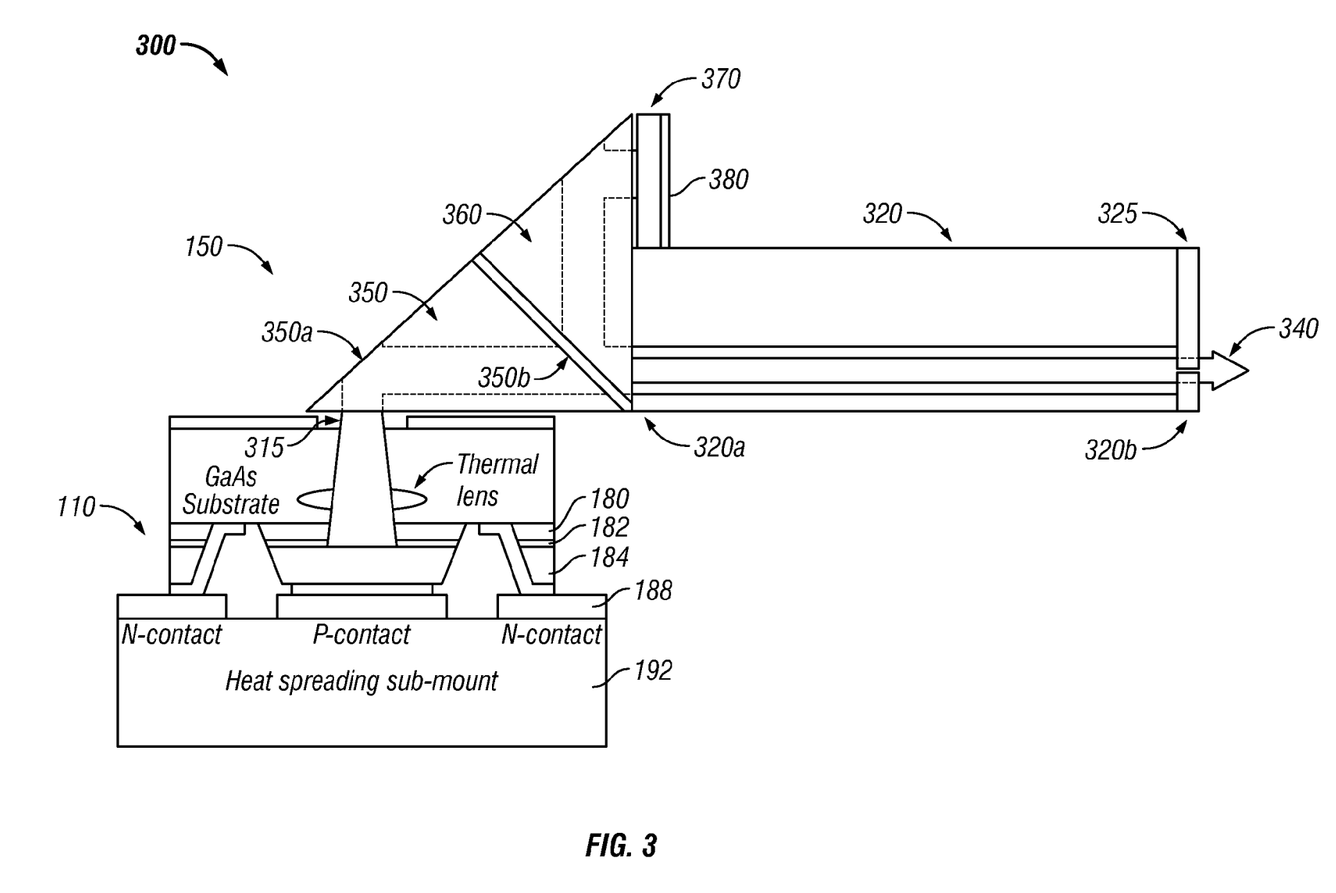
FIG. 3 illustrates yet another embodiment of an apparatus for producing light using laser emission and a frequency multiplier.

FIG. 3 shows another illustrative embodiment 300 suitable for multiplying the frequency of an infrared laser emission. The exemplary embodiment 300 includes the laser 110, such as a VCSEL or another solid-state laser, a frequency multiplier 320 for multiplying the frequency of the laser emission of the laser 110 to a wavelength of the visible spectrum of light, and a first optical interface 150 for receiving laser emission 315 from the laser and directing the laser emission into the frequency multiplier. The frequency multiplier 320 has a first surface at an input end 320*a* and a second surface at an output end 320*b*. The output end 320*b* may have a second optical interface, such as an output optical element 160 arranged to reflect IR laser emissions back into the frequency multiplier and transmit visible laser light out of the frequency multiplier to produce output beam 140.

The first optical interface 150 may further include a first prism 350 and a second prism 360, wherein a face of the first prism is aligned with a face of the second prism, and the aligned faces have an IR pass filter 350*b* disposed therebetween. The first prism has a reflection surface and a surface in optical contact with the laser 110. The second prism has a reflection surface and a surface in contact with the frequency multiplier and a quarter-wave plate. The first and second prisms may be arranged to have a polarizing beam splitter 350*a* disposed along their reflection faces. In one aspect, the IR laser emission 315 originating at the laser enters the first prism, reflects off of the beam splitter 350*a* at the reflection surface of the first prism, passes through the IR pass filter 350*b* into the second prism and into the input end of the frequency multiplier 320. In another aspect, backward propagating light from the frequency multiplier 320 exit the input end 320*a*, enters the second prism 360, reflects off of the IR pass filter 350*b* and the beam splitter 350*a* and passes through a quarter-wave plate 370 to a reflector 380. The reflector reflects the incident light back through the quarter-wave plate 370. In another aspect, the reflected light at the reflector 380 is directed through the quarter-wave plate 370 into the second prism 360, reflects off of the beam splitter 360*a* and the IR pass filter 350*b* and into the input end 320*a* of the frequency multiplier. Within the frequency multiplier, the light that traverses the quarter-wave plate has a different polarization than the light originating at the laser 110. As a result of the combination of light beams, the output beam 340 includes visible wavelength laser light having a mixture of polarizations. The output beam 340 thus may include both s-polarized (perpendicular to the plane of incidence) visible wavelength laser light as well as p-polarized (parallel to the plane of incidence) visible wavelength laser light. An output beam 340 that includes different polarization states can be suitable for optical elements used in sequential color display systems, for example, to reduce speckle in a final screen image.

Figure 4:
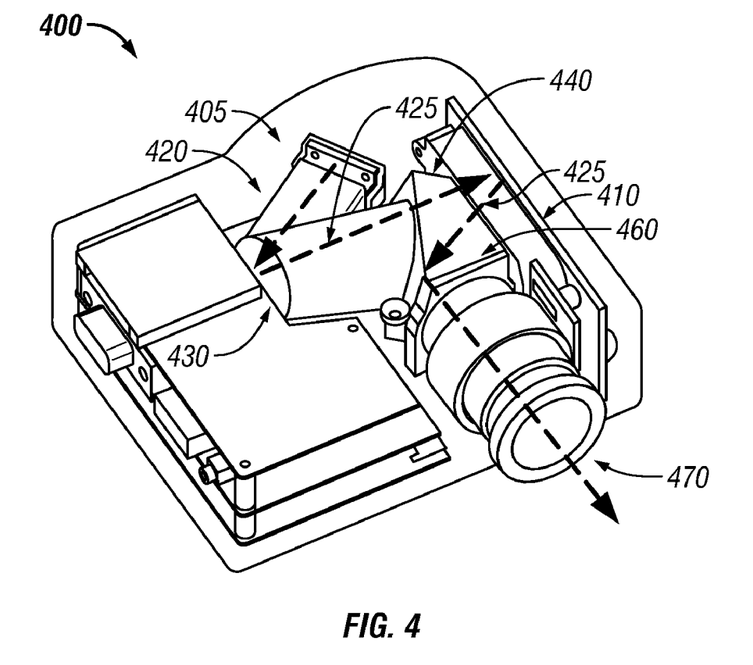
FIG. 4 schematically illustrates an exemplary embodiment of a light projection optical system that may utilize a frequency multiplier of the type shown in FIGS. 1-3.

FIG. 4 shows an exemplary light projection optical system usable to project a spatially modulated light beam as described in the present disclosure. The optical system includes a coherent light source such as a laser illuminator 405. The projector 400 includes one or more light collection, integration, and/or etendue-matching optical elements 420 arranged to collect and/or to spatially integrate light emitted by the light source. Etendue, as one skilled in the art and having the benefit of the present disclosure would know, is the product of the area of emission and the solid angle into which the emission is emitted. The projector 400 may also optionally include a relay 430 (such as a telecentric relay) using one or more aspherical refractive and/or reflective components (not shown), and/or a pupil (not shown) for controlling stray light. The projector 400 may also optionally include an illumination wedge prism 440 to direct a light beam such as beam 425 towards an optical element. The projector 400 also includes a spatial light modulator (SLM) 410, such as the digital micro mirror device (DMD) of Texas Instruments, arranged to modulate spatially substantially the light 425 projected onto it. The projector may also include a projection total internal reflection (TIR) prism 460 disposed between the illumination wedge prism 440 and the digital micro mirror device (DMD) 410. In one aspect, the TIR prism 460 may be separated by an air gap (not shown) from the illumination wedge prism 440. The projector may also include a projection lens 470 for projecting the output beam onto a display screen.

The relay 430 provides substantially all the light emitted by the laser illuminator 405 through the illumination wedge prism 440 and through the projection total internal reflection (TIR) prism 460 to the digital micromirror device (DMD) 410. The DMD reflects and spatially modulates light 425 back through the projection total internal reflection (TIR) prism 460 that totally internally reflects the spatially modulated light 420 through the projection lens 470 and onto a projection display screen.

Figure 5:
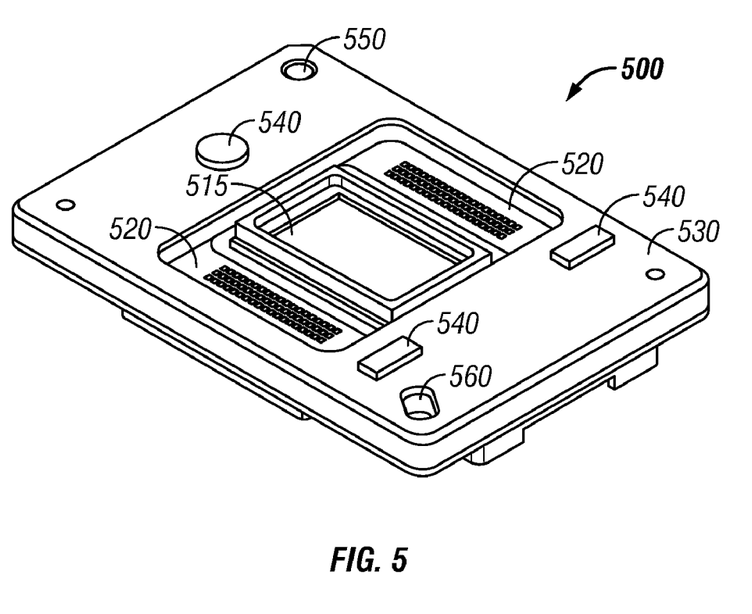
FIG. 5 schematically illustrates an exemplary spatial light modulator suitable for use with the apparatus of FIGS. 1-3 for producing an image for display on a display medium.

FIG. 5 shows an illustration of an exemplary spatial light modulator (SLM) 500 suitable for use with the apparatus described in relation to FIGS. 1-3 of the present disclosure. FIG. 5 shows, in particular, a top perspective view of an SLM 500 usable with an integrated circuit, such as the micro-electro-mechanical system (MEMS) spatial light modulator (SLM) integrated circuit. The SLM 500 has a wafer level package (WLP) DMD chip 515 bonded thereon. One of ordinary skill in the art having the benefit of the present disclosure would appreciate that the device 500 could be used with any suitable integrated circuit, including the MEMS SLM integrated circuit described herein. In one aspect, the device 500 may have the DMD chip 515 wire-bonded on two sides to bond pad area 520. A top surface 530 may provide a substantially flat area for a system aperture and gasket all around (not shown). The device 500 may also have one or more primary datum ('a') alignment features 540, one or more secondary datum ('B') alignment features 550, and one or more tertiary datum ('C') alignment features 560 disposed on the top surface 530. In one embodiment, the SLM may be actuated to orient a light beam at a frequency consistent to provide an image of a single frame at a display screen. Each micro mirror of the SLM is actuated according to a selected program. In one aspect, a micro mirror may be actuated in response to an electric current passing through a piezoelectric material attached to the micro mirror.

Figure 6:
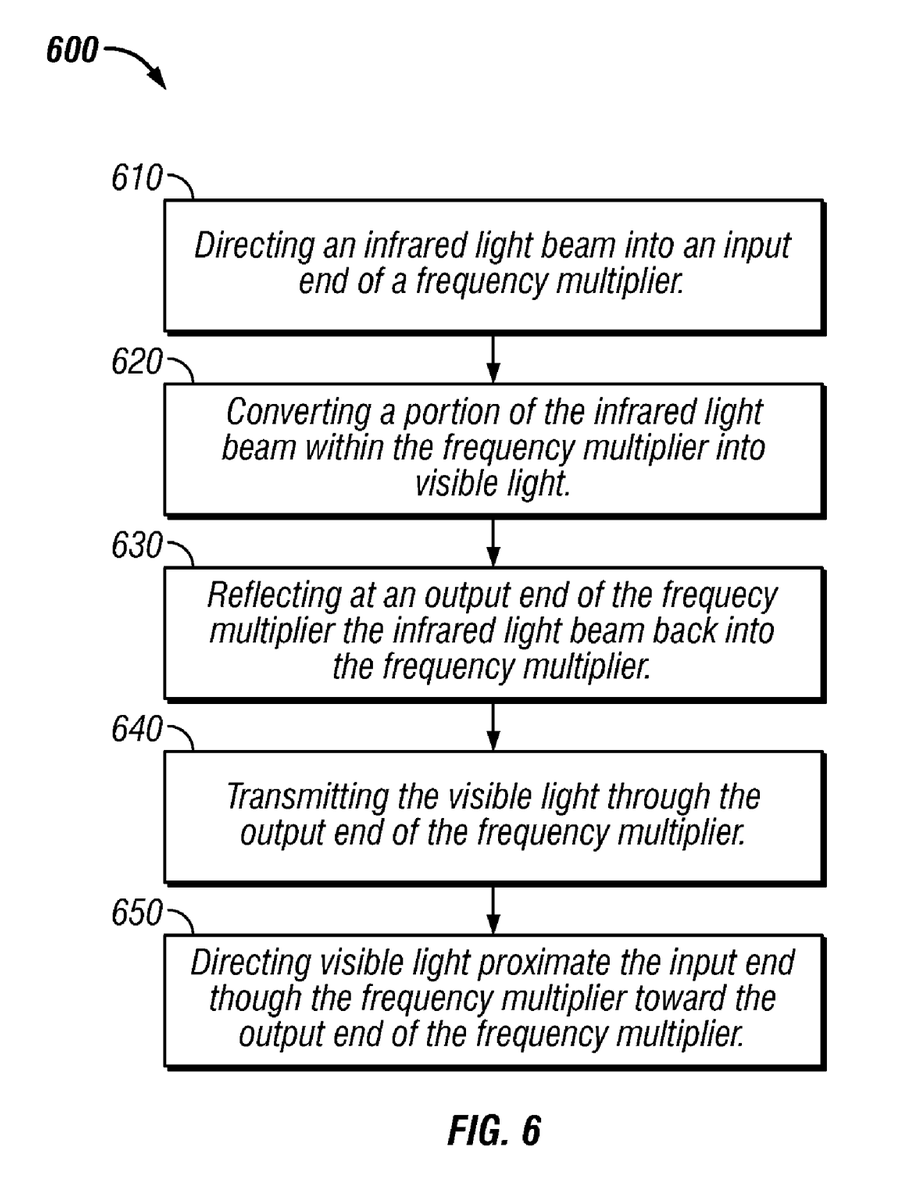
FIG. 6 illustrates a flowchart of an exemplary method according to one aspect of the disclosure.

FIG. 6 describes an exemplary method according to one aspect of the disclosure for producing light using laser emission. The method 600 includes providing a first beam comprising the infrared laser emission into an input end of a frequency multiplier as indicated at 610. The method 600 also provides for converting within the frequency multiplier at least a portion of IR light into visible laser light having a second frequency, as indicated at 620. The method 600 further provides reflecting the IR light beam back into the frequency multiplier at an output end of the frequency multiplier, as indicated at 630.

The method 600 further may include transmitting the visible light through the output end of the frequency multiplier, as indicated at 640. The method 600 may further include directing visible light present proximate the input end through the frequency multiplier toward the output end of the frequency multiplier as indicated at 660. The method may further include rotating a polarization of the visible light. The output may include collimated polarized broadband visible laser light.

Thus, in one aspect, the present disclosure provides an apparatus for producing light that includes: a laser that produces light corresponding to a first wavelength; an optical device that converts the light corresponding to the first wavelength received at an input end thereof into light corresponding to a second wavelength; and a first optical interface proximate the input end of the optical device that directs light corresponding to the second wavelength through the optical device toward an output end of the optical device. The first optical interface may be a color filter that allows transmission of light produced by the laser into the first end of the optical device. The first optical interface typically is arranged in a manner that is one of: (i) aligned substantially perpendicular to the input end of the optical device; (ii) attached to the input end of the optical device; and (iii) sprayed onto a surface of the optical device. The first optical interface may include one of: (i) a diffractive element; (ii) a holographic element; (iii) a dielectric material; and (iv) a glass. In one aspect, the light corresponding to the first wavelength is an infrared light and the light corresponding to the second wavelength is a visible light. The optical device may be a frequency multiplier that is adapted to double the frequency of light corresponding to the first wavelength.

The apparatus also may include a second optical interface proximate the output end of the optical device that reflects light corresponding to the second wavelength back into a cavity associated with the optical device. The second optical interface may be a color filter that is arranged in manner that is one of: (i) aligned substantially perpendicular to the output end of the optical device; (ii) attached to the output end of the optical device; and (iii) sprayed onto a surface of the optical device. A prism may be used to fold the light corresponding to the first wavelength at a suitable angle, including substantially 90 degrees, prior to input of such light to the first optical interface. At least one of the first optical interface and the second optical interface may be polarized in a selected plane to enhance the laser output and coupling to polarization-sensitive PPLN and PPT elements.

In another aspect, a method for producing light is provided that includes producing a laser light at a first wavelength, converting the light at the first wavelength into a light at a second wavelength in an optical element, and directing at least a portion of the light at the second wavelength present proximate an input end of the optical element through the optical element and toward an output end of the optical element. In one aspect, the light at the first wavelength may be IR light and the light at the second wavelength may be a visible light. The method may include doubling the frequency of the IR light to produce the visible light. In another aspect, the method may include reflecting at least a portion of the light at the first wavelength from the output end of the optical element back into the optical element. In another aspect, the method may include folding light produced by the laser by a selected angle prior to receiving such light at the input end of the optical element. Directing at least a portion of the light may include reflecting visible light traveling toward the input end back into the optical element. In another aspect, the method provides for reducing an interference pattern between light beams passing in opposite directions through the optical element. In another aspect, the method provides for reflecting light corresponding to the first wavelength proximate the second end back into the optical element While the foregoing disclosure is directed to certain specific embodiments that include certain specific elements, such embodiments and elements are shown as examples and various modifications thereto apparent to those skilled in the art may be made without departing from the concepts described and claimed herein. It is intended that all variations within the scope of the appended claims be embraced by the foregoing disclosure.

What is claimed is:

1. An apparatus, comprising:
   a laser that produces light corresponding to a first wavelength;
   an optical element that converts the light corresponding to the first wavelength received at a first surface thereof into light corresponding to a second wavelength;
   a first optical interface that directs light corresponding to the second wavelength through the optical element toward a second surface of the optical element; and
   a prism assembly comprising a first prism, a second prism, and a filter between the first and second prism, the prism assembly operable to fold the light corresponding to the first wavelength prior to input of such light to the first optical interface.

2. The apparatus of claim 1, wherein the first optical interface is a filter that transmits the light produced by the laser into the first surface of the optical element.

3. The apparatus of claim 1, wherein the first optical interface is arranged in manner that is one of:

(i) aligned substantially perpendicular to a propagation axis of the light produced by the laser;
(ii) attached to the first surface of the optical element; and
(iii) sprayed onto the optical element.

4. The apparatus of claim 1, wherein the first optical interface comprises one of:
(i) a diffractive element;
(ii) a holographic element;
(iii) a dielectric material; and
(iv) a glass member.

5. The apparatus of claim 1, wherein the light corresponding to the first wavelength is an infrared light and the light corresponding to the second wavelength is a visible light.

6. The apparatus of claim 1, wherein the optical element is a frequency multiplier that is adapted to double the frequency of light corresponding to the first wavelength.

7. The apparatus of claim 1 further comprising a second optical interface proximate the second surface of the optical element that reflects light corresponding to the first wavelength back into a cavity associated with the optical element.

8. The apparatus of claim 7, wherein the second optical interface is a filter that is arranged in manner that is one of:
(i) aligned substantially perpendicular to a propagation axis of the light produced by the laser;
(ii) attached to the second surface of the optical element; and
(iii) sprayed onto a surface of the optical element.

9. The apparatus of claim 1, wherein the optical element is one of a:
(i) periodically-poled lithium niobate element; and
(ii) periodically poled lithium tantalate element.

10. A method of producing light, comprising:
producing a laser light at a first wavelength;
converting the light at the first wavelength into a light at a second wavelength within an optical element;
reducing an interference pattern between light beams passing in opposite directions through the optical element; and
directing at least a portion of the light at the second wavelength present proximate an input end of the optical element through the optical element and toward an output end of the optical element and, reflecting at least a portion of the light at the first wavelength from the output end of the optical element back into the optical element.

11. The method of claim 10, wherein converting the light comprises doubling the frequency of the light at the first wavelength.

12. The method of claim 10 farther comprising folding light produced by the laser by a selected angle prior to receiving such light at the input end of the optical element.

13. The method of claim 10, wherein directing at least a portion of the light comprises reflecting visible light traveling toward the input end back into the optical element.

14. The method of claim 10 further comprising reflecting light corresponding to the first wavelength proximate the second end back into the optical element.

* * * * *